US012747499B2

(12) United States Patent
Soininen

(10) Patent No.: US 12,747,499 B2
(45) Date of Patent: Sep. 29, 2026

(54) ATOMIC LAYER DEPOSITION APPARATUS

(71) Applicant: BENEQ OY, Espoo (FI)

(72) Inventor: Pekka Soininen, Espoo (FI)

(73) Assignee: BENEQ OY, Espoo (FI)

( * ) Notice: Subject to any disclaimer, the term of this patent is extended or adjusted under 35 U.S.C. 154(b) by 570 days.

(21) Appl. No.: 18/248,405

(22) PCT Filed: Oct. 11, 2021

(86) PCT No.: PCT/FI2021/050671
§ 371 (c)(1),
(2) Date: Apr. 10, 2023

(87) PCT Pub. No.: WO2022/079349
PCT Pub. Date: Apr. 21, 2022

(65) Prior Publication Data

US 2023/0374658 A1 Nov. 23, 2023

(30) Foreign Application Priority Data

Oct. 12, 2020 (FI) ..................................... 20205996

(51) Int. Cl.
*C23C 16/455* (2006.01)
*C23C 16/44* (2006.01)
*C23C 16/458* (2006.01)

(52) U.S. Cl.
CPC .... *C23C 16/45551* (2013.01); *C23C 16/4408* (2013.01); *C23C 16/4412* (2013.01); *C23C 16/45563* (2013.01); *C23C 16/4584* (2013.01)

(58) Field of Classification Search
None
See application file for complete search history.

(56) References Cited

U.S. PATENT DOCUMENTS

2009/0304924 A1 12/2009 Gadgil
2011/0203524 A1 8/2011 Uno
(Continued)

FOREIGN PATENT DOCUMENTS

CN 101415977 A 4/2009
KR 20090031496 A 3/2009
(Continued)

OTHER PUBLICATIONS

International Search Report issued by the Finnish Patent and Registration Office acting as the International Searching Authority in relation to International Application No. PCT/FI2021/050671 dated Feb. 3, 2022 (5 pages).
(Continued)

*Primary Examiner* — Jason Berman
(74) *Attorney, Agent, or Firm* — Carter, DeLuca & Farrell, LLP

(57) ABSTRACT

An atomic layer deposition layer apparatus including a substrate support having a support surface, a precursor supply head having an output face with at least one reaction zone via which precursors are supplied, and a rotating mechanism. The substrate support and the precursor supply head are arranged to be rotated relative to each other with the rotating mechanism. The at least one reaction zone includes a precursor supply zone open to the output face of the precursor supply head for supplying precursor, and a suction zone open to the output face of the precursor supply head and arranged to surround the precursor supply zone at the output face of the precursor supply head.

16 Claims, 11 Drawing Sheets

(56) References Cited

U.S. PATENT DOCUMENTS

| | | | | |
|---|---|---|---|---|
| 2011/0268891 | A1 | 11/2011 | MacNeil et al. | |
| 2012/0003396 | A1 | 1/2012 | Maas et al. | |
| 2013/0001330 | A1* | 1/2013 | Huang | C23C 16/45574 118/712 |
| 2015/0275365 | A1 | 10/2015 | Pak et al. | |
| 2015/0361553 | A1* | 12/2015 | Murakawa | C23C 16/45561 156/345.55 |
| 2018/0366315 | A1 | 12/2018 | Hane et al. | |
| 2020/0149168 | A1 | 5/2020 | Honma | |

FOREIGN PATENT DOCUMENTS

| | | | |
|---|---|---|---|
| TW | M519316 | U | 3/2016 |
| TW | 201715078 | A | 5/2017 |

OTHER PUBLICATIONS

Written Opinion of the Internation Searching Authority issued by the Finnish Patent and Registration Office acting as the International Searching Authority in relation to International Application No. PCT/FI2021/050671 dated Feb. 3, 2022 (5 pages).

Finnish Search Report issued by the Finnish Patent and Registration Office in relation to Finnish Patent Application No. 20205996 dated May 12, 2021 (2 pages).

Twainese Office Action issued by the Twainese Patent Office in relation to Twainese Application No. 110137096 dated Apr. 14, 2022 (1 page).

* cited by examiner

ATOMIC LAYER DEPOSITION APPARATUS

CROSS-REFERENCE TO RELATED APPLICATIONS

This application is a national phase entry under 35 U.S.C. 371 of PCT International Application No. PCT/FI2021/050671 filed Oct. 11, 2021, which claims priority to Finnish Patent Application No. 20205996, filed Oct. 12, 2020, the disclosure of each of these applications is expressly incorporated herein by reference in their entirety.

FIELD OF THE INVENTION

The present invention relates to an atomic layer deposition apparatus for processing a surface of a substrate with at least a first precursor and a second precursor according to principles of atomic layer deposition.

BACKGROUND OF THE INVENTION

Manufacturing or coating substrates and especially planar substrates such as semiconductor wafers, with atomic layer deposition high throughput and high quality of formed thin films are important. However, in prior art devices the high throughput, or processing speed, of the apparatus and high coating quality are often contradictory relative each other. This means that increasing the throughput of the apparatus the coating quality is compromised. On the other hand, achieving high coating quality requires lowering the throughput of the apparatus.

Prior art atomic layer deposition apparatuses comprise solution in which a rotating substrate support is used. One or more substrates are supported on a support surface of the substrate surface. A precursor supply head is positioned opposite the substrate support such that an output face of the precursor supply head is arranged opposite and parallel to the support surface of the substrate support. A reaction gap is provided between the support surface and the output face. Precursor material or materials are supplied via the output face towards the support surface to which the one or more substrates are supported for subjecting the surface of the substrate to precursors. The output face comprises one or more reaction zones or precursor nozzles via which the precursors are supplied towards the support surface and the substrate. The substrate support is rotated around a rotating axis which is perpendicular to the support surface. When the substrate support is rotated, the one or more substrates move successively and repeatedly under the one or more reaction zone or precursor nozzles thus subjecting the surface if the substrate to precursors.

In the apparatuses disclosed above, the throughput is increased by increasing the rotating speed substrate support such that the substrate travels at increased velocity under and past the reaction zones or precursor nozzles of the precursor supply head. However, in the prior art apparatuses the quality of the coating deteriorates when the rotating speed is increased. This caused by the precursor gas flow from the reaction zone or the precursor nozzle tends to start following the rotating movement of the substrate support or the rotating substrate support drags the precursor along. Accordingly, the precursor material escapes from the reaction zone. This may further cause the different precursor to mix in reaction chamber surrounding the substrate support. Gas phase precursor reaction may occur instead of surface reaction on the surface of the substrate. The gas phase precursor reactions are prevented by arranging a very powerful suction or discharge flow to the reaction chamber. However, this may cause disturbance to the much smaller precursor flow.

BRIEF DESCRIPTION OF THE INVENTION

An object of the present invention is to provide an atomic layer deposition apparatus so as solve or at least alleviate the prior art disadvantages.

The preferred embodiments of the invention are disclosed in the dependent claims.

The invention is based on the idea of providing an atomic layer deposition apparatus for processing a surface of a substrate successively with at least a first precursor and a second precursor according to principles of atomic layer deposition. The apparatus comprises a substrate support having a support surface and arranged to support one or more substrates, and a precursor supply head having an output face. The output face is provided with at least one reaction zone via which precursors are supplied. The support surface of the substrate support and the output face of the precursor supply head are arranged opposite to each other such that a reaction gap is provided between the support surface of the substrate support and the output face of the precursor supply head.

The support surface and the output face are preferably arranged parallel to each other such that the reaction gap is uniform between the support surface and the output face.

The apparatus further comprises a rotating mechanism. The substrate support and the precursor supply head are arranged to be rotated relative to each other with the rotating mechanism such that the support surface of the substrate support and the output face of the precursor supply head are arranged to be rotated relative to each other.

Therefore, a substrate arranged to the support surface travels past the one or more reaction zones of the output face. Precursors are supplied from the reaction zone of the output face towards the substrate support and the substrate via the reaction gap and thus the substrate surface is subjected to the precursors as it travels past the reaction zones. Accordingly, the substrate is subjected to the precursors successively as the substrate support and the precursor supply head are rotated relative to each other with the rotating mechanism.

According to the present invention, the at least one reaction zone comprises a precursor supply zone open to the output face of the precursor supply head for supplying precursor, and a suction zone open to the output face of the precursor supply head and arranged to surround the precursor supply zone at the output face of the precursor supply head.

Accordingly, the precursor supply zone is arranged to form a precursor supply nozzle or a precursor supply area via which the precursor is supplied towards the substrate support via the reaction gap. The precursor supply zone is provided to the output face of the precursor supply head and arranged open to the output face.

The suction zone is arranged to form a suction nozzle or a suction slot or the like via which the precursor and possible other gases are discharged from the output face and from the reaction gap. The suction zone is provided to the output face of the precursor supply head and arranged open to the output face.

The suction zone is arranged to surround the precursor supply area on the output face. Accordingly, excess precursor is removed and discharged from the output face and from the reaction gap around the precursor supply zone. Thus, the precursor supply zone is isolated from the surroundings, or gases are prevented or hindered from entering the precursor supply zone from outside during relative rotation of the output face and the support surface. Therefore, mixing of different precursors are prevented or decreased during the coating process when the substrate support and the precursor supply head are rotated relative to each other.

Furthermore, the precursor supply flow may be isolated from the surroundings such that a uniform precursor flow may be achieved irrespective of other gas flows outside the reaction zone of the output face. Thus, high coating quality may be achieved with higher rotating speeds.

In one embodiment of the invention, the rotating mechanism is connected to the substrate support and arranged to rotate substrate support. This is preferably, as the substrates may be secured to the support surface are transported past the stationary reaction zones provides to the output face.

In another embodiment, the rotating mechanism is connected to the precursor supply head and arranged to rotate the precursor supply head. This enables providing all process equipments to a single element in the apparatus as the gases may be supplied and discharged via the precursor supply head. Further, the rotating mechanism is provided to the same precursor supply head.

In a further embodiment, the rotating mechanism is connected to the substrate support and to the precursor supply head and arranged to rotate both the substrate support and the precursor supply head relative to each other.

In one embodiment, the output face of the precursor supply head and the support surface of the substrate support are arranged parallel to each other such that a uniform reaction gap is provided between the support surface of the substrate support and the output face of the precursor supply head.

The uniform reaction gap enables uniform gas distribution and supply towards the support surface and the surface of the substrate. The uniforms gas distribution provides uniform and high coating quality.

In the context of this application the output face of the precursor supply head is provided as planar or substantially planar surface. The output face comprises one or more reaction zones. In some embodiments, the output face comprises a first reaction zone for a first precursor and a second reaction zone for a second precursor.

Further, the output face and the support surface are arranged opposite to each other such that the uniform reaction gap is formed. The output face is arranged to extend over the whole support surface such that the reaction gap is uniform over the whole support surface to which the substrates are supported. Accordingly, the output face is arranged to cover the support surface. The output face and the support surface are arranged parallel to each other.

Accordingly, as the output face is arranged to extend over the whole support surface, the reaction gap is open to the surroundings at the edges of the reaction gap or at the circumference edge(s) or peripheral of the reaction gap.

Therefore, when the apparatus comprises a process chamber having the process chamber space, the reaction gap is open to the chamber are the peripheral edge(s).

In one embodiment, the rotating mechanism comprises a rotating axis. The rotating axis is arranged perpendicularly to the output face, or the support surface or the output face and the support surface. Accordingly, the rotating axis and the rotating mechanism is arranged to rotate the support surface or the output face in one plane. Preferably, the support surface and the output face are parallel to each other and the rotating axis is perpendicular to both the output face and the support surface. Thus, the reaction gap may be may constant and uniform during the rotation and the processing.

In one embodiment, the precursor supply zone of the reaction zone is formed as a precursor supply area and arranged as a central area of the reaction zone. Accordingly, the precursor is supplied from the central area of the reaction zone and thus the substrate may be subjected to the precursor on predetermined area as it travels past the reaction zone. Further, this enables isolating the precursor supply zone efficiently from the surrounding.

In one embodiment, the precursor supply zone is provided as a recess to the output face of the precursor supply head. The recess is open to the output face of the precursor supply head. The recess enables distributing the precursor in the precursor supply zone evenly such that uniform precursor supply towards the surface of the substrate may be achieved. The recess further provides the precursor supply area having dimensions along the output surface for providing necessary exposure for the substrate passing the reaction zone and the precursor supply zone.

In one embodiment, the precursor supply zone of the reaction zone comprises two or more precursor supply openings open to the output face of the precursor supply head for distributing precursor over the precursor supply zone.

The two or more precursor supply openings enable even distribution of precursors over the precursor supply zone and further towards the support surface and substrate surface.

In another embodiment, the precursor supply zone of the reaction zone comprises one or more precursor supply openings open to the recess for distributing precursor to the recess and over the precursor supply zone.

The precursor enters the recess from the one or more precursor supply openings. The recess and the suction zone surrounding the recess causes the precursor spread evenly in the recess and in the precursor supply zone for providing uniform precursor flow towards the support surface.

In a further embodiment, the precursor supply zone of the reaction zone comprises a precursor distribution element provided to the precursor supply zone and comprising one or more precursor distribution openings open to the output face of the precursor supply head for distributing precursor over the precursor supply zone.

The precursor distribution element is arranged to distribute the precursor flow over the precursor supply zone or the precursor supply area for providing uniform precursor flow towards the support surface. Preferably the precursor distribution element comprises two or more, more preferably several, precursor distribution openings arranged over the precursor supply zone.

In a yet further embodiment, the precursor supply zone of the reaction zone comprises a precursor distribution element provided to the recess. The precursor distribution element comprises one or more precursor distribution openings open to the recess for distributing precursor to the recess and over the precursor supply zone.

The precursor distribution element is arranged to distribute the precursor flow to the recess from which the precursor may uniformly flow towards the support surface and the substrate. Preferably the precursor distribution element comprises two or more, more preferably several, precursor distribution openings arranged over the recess. The precursor enters the recess from the one or more distribution openings. The recess and the suction zone surrounding the recess causes the precursor spread evenly in the recess and in the precursor supply zone for providing uniform precursor flow towards the support surface.

In one embodiment, the precursor supply head comprises a head centre point provided in line with the rotating axis of the rotating mechanism. Width of the precursor supply zone, or the precursor supply area or the recess increases in a direction away from the head centre point.

Accordingly, the width of the precursor supply zone, or the precursor supply area or the recess increases in radial direction away from the head centre point. The width of the precursor supply zone, or the precursor supply area or the recess is perpendicular to the radial direction from the head centre point.

The increasing width in the direction away from the head centre point enables providing equal residence or pass time for the substrate at different distances from the rotation axis and the head central point. Thus, different parts of the substrate are evenly subjected to precursor during rotation and travel pass the reaction zone.

In one embodiment, the suction zone is arranged to surround the precursor supply zone circumferentially on the output face of the precursor supply head.

Accordingly, the suction is arranged similarly form all direction around the precursor supply zone. This enables isolating the precursor supply zone from the surroundings at all directions. Further, the suction provided from the suction zone enhances distribution of the precursor over the whole precursor supply zone.

In another embodiment, the suction zone is provided as a suction slot arranged to surround the precursor supply zone circumferentially on the output face of the precursor supply head. The circumferential slot surrounds the precursor supply zone enabling efficient and even suction of the precursor.

In one embodiment, the reaction zone further comprises a purge gas supply zone open to the output face of the precursor supply head and arranged to surround the suction zone and the precursor supply zone at the output face of the precursor supply head. The suction zone is arranged between the precursor supply zone and the purge gas supply zone at the output face of the precursor supply head.

The purge gas zone further enables isolating the precursor supply zone form the surroundings and the other precursors during processing. Thus, the purge gas zone provides gas curtain and barrier gas flow between the surroundings and the precursor supply zone. Further, the suction zone is arranged between the precursor supply zone and the purge gas supply zone such that the purge gas from the purge gas zone and the precursor form the precursor supply zone flow to the suction zone preventing precursor from escaping form the reaction zone and providing a uniform and steady precursor flow.

In one embodiment, the purge gas supply zone is arranged to surround the suction zone circumferentially on the output face of the precursor supply head.

Accordingly, the suction is provided similarly from all direction around the precursor supply zone and all direction purge gas supply zone. Thus, a purge gas flow opposite to the precursor flow is generated towards the suction zone. This enables isolating the precursor supply zone from the surroundings at all directions.

In another embodiment, the purge gas supply zone is provided as a purge gas slot arranged to surround the suction zone circumferentially on the output face of the precursor supply head.

Therefore, the precursor supply zone is separated from the surroundings with the suction slot and with the purge gas supply slot from all directions. This enables providing a steady and undisturbed precursor flow towards the substrate support and substrate surface during processing and relative rotation of the precursor supply head and the substrate support.

In one embodiment, the precursor supply head comprises two or more reaction zones on the output face of the precursor supply head.

The reaction zones may be arranged to supply same or different precursors. Increasing the number of reaction zones enhances the efficiency of the apparatus as the number of coating layers per rotation cycle may be increased. However, at the same time the increasing of the reaction zones on the output faces increases possibility of mixing of different precursor materials. Further, the structure of the reaction zone of the present invention may enable utilizing larger number of reaction zone on the output face without excessive mixing of the different precursors.

In another embodiment, the precursor supply head comprises a first reaction zone and second reaction zone on the output face of the precursor supply head.

The first reaction zone may be connected to a first precursor source and arranged to supply the first precursor towards the substrate support during processing and the rotation. The second reaction zone may be connected to a second precursor source and arranged to supply the second precursor towards the substrate support during processing and the rotation.

Further, in some embodiments there may be two or more first and second reaction zones on the output face. The first and second reaction zones are provided successively and alternately on the output face in the rotation direction.

Accordingly, the surface of the substrate is subjected alternately to the first and second precursor during the rotational movement in the processing.

In a further embodiment, the precursor supply head comprises a first reaction zone and second reaction zone on the output face of the precursor supply head. The first and second reaction zone are arranged opposite to each other on opposite sides of the head centre point.

Thus, the first and second reaction zone and also the first and second precursor are physically separated from each other and spaced apart from each other on the output face and in the rotation direction.

Preferably there are two or more reaction zones provided symmetrically to the output face. They may be provided symmetrically in relation to each other. Further, they may be provided symmetrically in relation to the head centre point.

In one embodiment, the precursor supply head comprises intermediate purge gas feeding nozzles arranged adjacent the reaction zone on opposite sides the reaction zone on the output face.

The intermediate purge gas feeding nozzles are arranged to further prevent precursor mixing between the different reaction zones.

The intermediate purge gas feeding nozzles are arranged adjacent the reaction zone and on both opposite sides of the reaction zone on the output face in the rotation direction.

In another embodiment, the precursor supply head comprises intermediate purge gas feeding nozzles arranged between adjacent reaction zones.

The intermediate purge gas feeding nozzles are arranged between adjacent reaction zone on the output face in the rotation direction. Thus, the intermediate purge gas feeding nozzles further separate the adjacent reaction zones and precursor supplied from the adjacent reaction zones from each other.

In a further embodiment, the precursor supply head comprises intermediate purge gas feeding nozzles arranged between the first and the second reaction zones.

The intermediate purge gas feeding nozzles are arranged between the first and second reaction zone on the output face in the rotation direction. Thus, the intermediate purge gas feeding nozzles further separate the first and second reaction zone and precursor supplied from the first and second reaction zones from each other.

In one embodiment, the intermediate purge gas feeding nozzles are arranged to extend in direction between the adjacent reaction zones.

Accordingly, the intermediate purge gas feeding nozzles are arranged to extend in a direction from one reaction zone towards another.

Thus, the intermediate purge gas feeding nozzles are in some embodiments arranged to extend substantially in the rotation direction.

Further, the intermediate purge gas feeding nozzles are in some embodiments arranged to extend transversely or perpendicularly to radial direction of the rotating axis.

In another embodiment, the intermediate purge gas feeding nozzles are arranged to extend in a linear direction between the adjacent reaction zones.

In these embodiments, the purge gas flow may be directed in radial direction of the rotation. This provides efficient flow away from the output face, support surface and from the reaction gap.

In a further embodiment, the intermediate purge gas feeding nozzles have a longitudinal curved form and are arranged to extend between the adjacent reaction zones.

In a preferred embodiment, the intermediate purge gas feeding nozzles have a longitudinal curved form with constant radius from rotation axis. Thus, the curved intermediate purge gas feeding nozzles extend in the rotation direction between adjacent reaction zones.

In a yet further embodiment, the intermediate purge gas feeding nozzles are arranged to extend in a direction away from the head centre point of the precursor supply head.

In an alternative embodiment, the intermediate purge gas feeding nozzles are arranged to extend radially in a direction away from the head centre point of the precursor supply head.

In these embodiments, the intermediate purge gas feeding nozzles separate the adjacent reaction zones from each other. Further, the purge gas flow from the intermediate purge gas feeding nozzles is directed towards the reaction zones providing enhanced separation of the different precursors.

In one embodiment, the substrate support comprises one or more substrate holders provided on the support surface for holding one or more substrates.

The substrates are supported to the support surface such that a surface of the substrate, preferably a surface of a planar substrate, is arranged to face away from the support surface and towards the opposite output face.

Preferably there are two or more substrate holders provided symmetrically to the substrate support and support surface for providing balanced rotation.

Further, the substrates are supported preferably such that the planar surface of the substrate is parallel to the output face, or the output face and the support surface.

In another embodiment, the substrate support comprises one or more substrate holder recesses provided on the support surface for receiving one or more substrates, respectively.

The substrates are received in the recess.

In some embodiments, the recess is arranged receive the substrate such that the upper surface of the substrate facing towards the output face is below the support surface or flush with the support surface. This enables uniform gas flow on the support surface and further improves coating quality.

In one embodiment, the substrate support is arranged in vertical direction below the precursor supply head.

Accordingly, the precursor supply head is arranged above substrate support in vertical direction. In this embodiment, the support surface and the output face are preferably arranged horizontally. Thus, the rotation axis extends vertically.

This provides structure in which the substrate may be efficiently loaded to and unloaded from the apparatus.

In one embodiment, the apparatus comprises a process chamber having a process chamber space inside the process chamber, and that the substrate support and the precursor supply head are arranged inside the process chamber.

In one embodiment, the apparatus comprises a process chamber having a process chamber space inside the process chamber, and that the support surface of the substrate support and the output face of the precursor supply head are arranged inside the process chamber. Accordingly, the substrate support may be entire inside the process chamber in the chamber space or only the support surface is provided inside the process chamber. In the latter case the support surface may be arranged to form one of the chamber walls or at least part of it. Further, the precursor supply head may be entire inside the process chamber in the chamber space or only the output face is provided inside the process chamber. In the latter case the output face may arranged to form one of the chamber walls or at least part of it.

In one preferred embodiment, the substrate support is provided inside the chamber space of the process chamber and the output face of the precursor supply head is provided inside chamber space. Thus, the precursor supply head is not entirely inside the chamber space. The output face may be arranged to one of the chamber walls, for example the top wall, or at least part of.

Thus, the processing of the substrates may be carried out in the process chamber preventing contamination.

In one embodiment, the process chamber comprises discharge connection provided to the process chamber and arranged to discharge gases from the process chamber space.

The discharge connection is preferably provided to a wall or walls of the process chamber. Thus, the purge gas and excessive precursors may be discharged form the process chamber.

The reaction gap is open to the chamber space, as described above, and thus the discharge connection is arranged to direct suction or underpressure to the reaction gap from the open peripheral or circumferential edge of the reaction for discharging excessive gases from the reaction gap via the chamber space.

An advantage of the invention is that the atomic layer apparatus of the present invention enables high quality coatings at high production throughput. In the present invention, the suction zone surrounding the precursor supply zone in the reaction zone on the output face of the precursor supply head enables uniform and steady precursor flow towards surface of the substrate even at higher rotation speeds. The purge gas supply zone further surrounding the suction zone enables increasing the rotation speed even more without compromising the coating quality.

BRIEF DESCRIPTION OF THE DRAWINGS

The invention is described in detail by means of specific embodiments with reference to the enclosed drawings, in which.

DETAILED DESCRIPTION OF THE INVENTION

Figure 1:
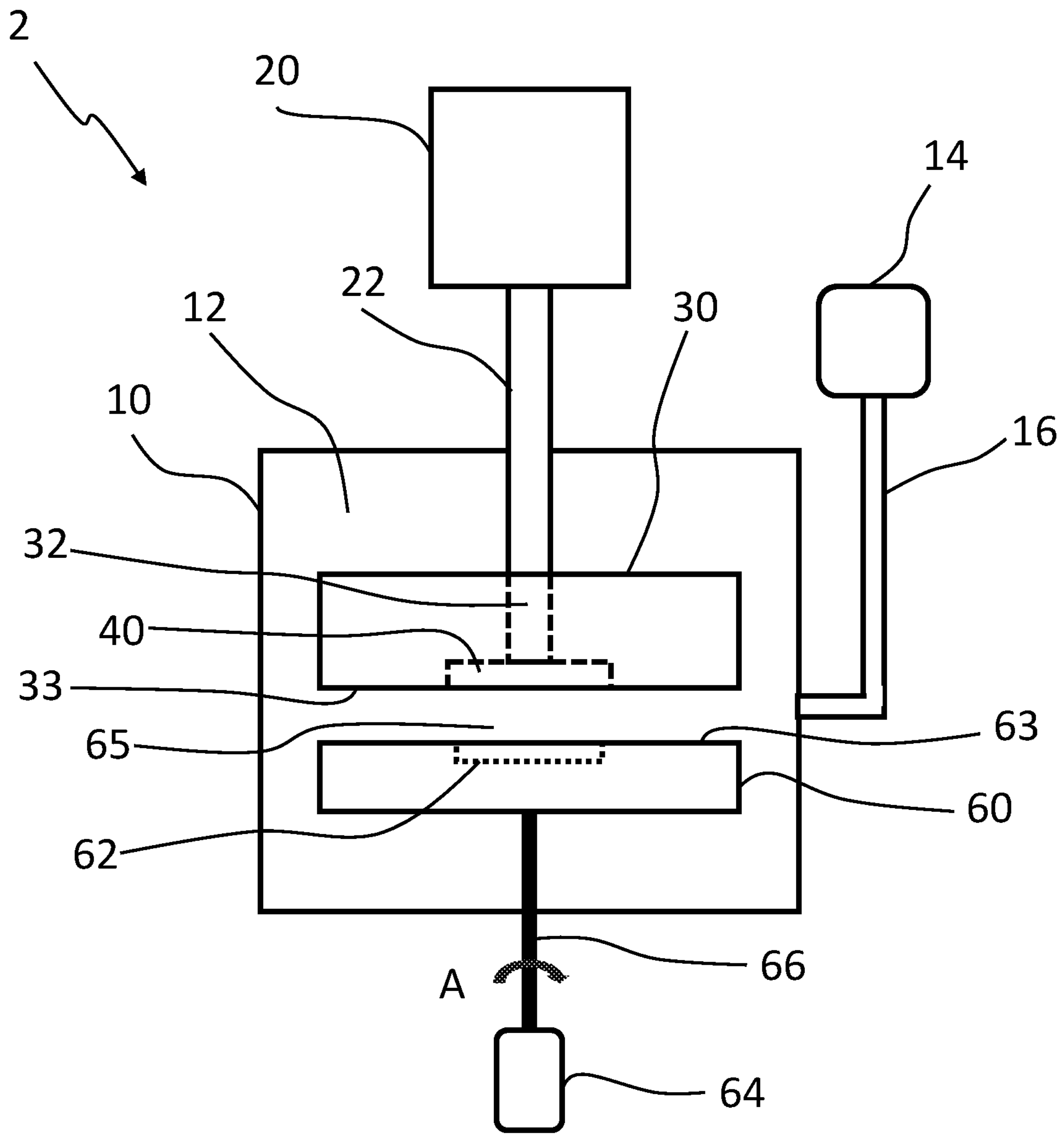
FIG. 1 shows a schematic view of an embodiment of an apparatus according to the present invention

FIG. 1 shows an atomic layer deposition apparatus 2 for processing a surface of a substrate successively with at least a first precursor and a second precursor according to principles of atomic layer deposition. The apparatus comprises a process chamber 10 having a process chamber space 12 inside the process chamber 10. The process chamber 10 comprises process chamber walls defining the process chamber space 12.

The process chamber 10 is provided as a vacuum chamber and connected vacuum device (not shown). Thus, the process chamber 10 is provided as the process chamber and as the vacuum chamber.

In an alternative embodiment, there is a separate vacuum chamber (not shown) surrounding the process chamber 10. Thus, the process chamber is provided inside the vacuum chamber. The vacuum chamber is connected to the vacuum device (not shown) for providing vacuum inside the vacuum chamber.

The substrates are processed inside the process chamber 10.

The apparatus 2 further comprises a substrate support 60 having a support surface 63 and arranged to support one or more substrates on the support surface 63. The substrate support 60 is arranged to support and hold one or more substrates during processing the substrates with the apparatus 2.

The substrate support 60 is provided inside the process chamber 10. Thus, the substrate support 60 is inside the process chamber space 12.

The support surface 63 is planar surface extending on a plane.

The substrates are ranged on the or in connection with the support surface 63. Preferably, the substrates are planar or plate-like substrates having two main substrate surfaces, such as silicon wafers.

The substrates are usually supported to the substrate support 60 such that the substrate surface or main substrate surface is parallel to the support surface 63.

The substrate support 60 comprises one or more substrate holders 62 arranged to secure and hold one or more substrates during processing. The substrate holders 62 are provided to the support surface 63 or in connection with the support surface 63.

The substrates are supported to the support surface 63 such that the upper surface facing away from the support surface 63 is flush with or at the level of the support surface 63.

In some alternative, embodiments the substrates are supported to the support surface 63 such that the upper surface facing away from the support surface 63 is below the support surface 63.

Further, in some embodiments, substrates are supported to the support surface 63 such that the upper surface facing away from the support surface 63 is above the support surface 63. In these embodiments, the substrates may be support directly on the support surface 63.

The apparatus of the present invention further comprises a precursor supply head 30 having an output face 33. The output face 33 is provided with at least one gas distribution element 40, 40' via which precursors are supplied. The one or more gas distribution elements 40, 40' provide one or more reaction zones 44, 44', respectively.

The precursor supply head 30 is provided inside the process chamber 10. Thus, the precursor supply head 30 is inside the process chamber space 12. Therefore, also the output face 33 of the precursor supply head 30 is inside the chamber space 12 of the process chamber 10.

The gas distribution elements 40, 40' and the reaction zones 44, 44' are provided to the output face 33 or in connection with the output face 33 such that precursors are supplied via the output face 33.

The precursor supply head 30 is connected to a precursor supply system 20. The precursor supply system 20 comprises precursor sources (not shown), such as precursor containers or the like, and one or more pumps and valves (not shown) for supplying precursors to the precursor supply head 30 via a supply conduits 22.

The precursor supply system 20 may also comprise purge gas sources (not shown), such as purge gas containers or the like, and one or more pumps and valves (not shown) for supplying purge gas to the precursor supply head 30 via the supply conduits 22.

The precursor supply system 20 may also comprise suction pump(s) for discharging gases from the output face 33 via the supply conduits 22.

The supply conduits 22 comprise one or more precursor conduits, one for each precursor. The precursor conduits are connected to the precursor sources in the precursor supply system 20.

The supply conduits 22 further comprise one or more purge gas conduits. The purge gas conduits are connected to the purge gas sources in the precursor supply system 20.

The supply conduits 22 further comprise one or more suction conduits. The suction conduits are connected to the suction pump(s) in the precursor supply system 20 for discharging gases.

As shown in FIG. 1, the precursor supply system 20 is arranged outside of the process chamber 10. The supply conduits 22 extends between the precursor supply system 20 and the precursor supply head 30. Accordingly, the supply conduits 22 extend from outside the process chamber 10 through the chamber walls into the process chamber 10 and further to the precursor supply head 30.

In embodiments comprising the separate vacuum chamber surrounding the process chamber 10, the precursor supply system 20 is arranged outside of the vacuum chamber. Accordingly, the supply conduits 22 extend from outside the vacuum chamber through the vacuum chamber walls into the vacuum chamber and further through the chamber walls into the process chamber 10 and to the precursor supply head 30.

The precursor supply head 30 comprises supply channels 32 for the precursors, purge and suction.

The supply channels 32 are connected to the corresponding supply conduits 22. Further, the supply channels 32 of the precursor supply head 30 are connected to the one or more gas distribution elements 40, 40', or one or more reaction zones 44, 44', respectively, of the precursor supply head 30.

The supply channels 32 may comprise one or more precursor supply channels, for supplying precursors. The precursor supply channels are connected to the one or more gas distribution elements 40, 40', or one or more reaction zones 44, 44', respectively. Each precursor may be provided with a separate precursor supply channel. The precursor supply channels are connected between the one or more gas distribution elements 40, 40', or one or more reaction zones 44, 44', respectively, and the precursor supply conduits of the supply conduit 20.

The supply channels 32 may comprise one or more purge gas supply channels, for supplying purge gas. The purge gas supply channel(s) are connected to the one or more gas distribution elements 40, 40', or one or more reaction zones 44, 44', respectively. The purge gas supply channels are connected between the one or more gas distribution elements 40, 40', or one or more reaction zones 44, 44', respectively, and the purge gas supply conduits of the supply conduit 20.

The supply channels 32 may comprise one or more suction channels, for discharging gases. The suction channel(s) are connected to the one or more gas distribution elements 40, 40', or one or more reaction zones 44, 44', respectively. The suction channel(s) are connected between the one or more gas distribution elements 40, 40', or one or more reaction zones 44, 44', respectively, and the suction conduits of the supply conduit 20.

According to the above mentioned, gas exchange between the precursor supply system 20 and the one or more gas distribution elements 40, 40', or one or more reaction zones 44, 44', is carried out via the supply conduits 22 and the supply channels 32.

As shown in FIG. 1, the support surface 63 of the substrate support 60 and the output face 33 of the precursor supply head 30 being arranged opposite to each other. The support surface 63 and the output face 33 are spaced apart from each other such that a reaction gap 65 is provided between the support surface 63 and the output face 33.

Precursors are supplied via the output face 33 towards the support surface 63 and the substrates arranged to the support surface 63 during processing. Further, precursors are supplied from the one or more gas distribution elements 40, 40', or one or more reaction zones 44, 44' towards the support surface 63 via the reaction gap 65. Therefore, during processing the precursors, as well as possible purge gas, travel in the reaction gap 65 towards or against the support surface 63 and the substrates support ted to the support surface 63.

The output face 33 of the precursor supply head 30 and the support surface 63 of the substrate support 60 are arranged parallel to each other. The parallel output face 33 and the support surface 63 together form a uniform reaction gap 65. The uniform reaction gap 65 means that the distance between the output face 33 and the support surface 33 is constant in the area between the output face 33 and the support surface 63.

In the embodiment of the FIG. 1, the substrate support 60 is arranged in vertical direction below precursor supply head 30. Further, the support surface 63 is arranged in vertical direction below the output face 33. Accordingly, the precursors and possible purge gas are supplied from the precursor supply head 30 via the output face 33 downwards and towards the support surface 63.

The output face 33 and the support surface 63 are both arranged in horizontal direction and parallel to each other.

In an alternative embodiment, the substrate support 60 is arranged in vertical direction above the precursor supply head 30. Also in this embodiment, the output face 33 and the support surface 63 are both arranged in horizontal direction and parallel to each other.

The substrate support 60 and the precursor supply head 30 are arranged inside the process chamber 10.

In the embodiment of FIG. 1, the substrate support 60 and the precursor supply head 30 are both arranged inside the chamber space 12.

The apparatus 2 further comprises a discharge system 14 connected to the process chamber 10. The discharge system 14 is arranged discharge gases form the process chamber space 12 inside the process chamber 10.

The discharge system 14 is connected to the process chamber walls with a discharge conduit 16. The discharge system 14 comprises one or more discharge pumps arranged to discharge gases from the chamber space 12 of the process chamber 10. The discharge system 14 and the discharge conduit together form a discharge connection 16, 14 provided to the process chamber 10 and arranged to discharge gases from the process chamber space 12.

The discharge device 14 is arranged outside the process chamber 10.

In embodiments comprising the separate vacuum chamber surrounding the process chamber 10, the discharge system 14 is arranged outside of the vacuum chamber. Accordingly, the discharge conduit 16 extends from outside the vacuum chamber through the vacuum chamber walls into the vacuum chamber and further to the chamber walls of the process chamber 10.

According to the present invention, the precursor supply head 30 and the substrate support 30 are rotated in relation to each other around a rotation axis 66.

The rotation axis 66 extends perpendicularly to the output face 33 and the support surface 63. Therefore, the reaction gap 65 is maintained constant during the rotation.

During the rotation, the substrates supported to the support surface travel in rotational motion in relation to the one or more gas distribution elements 40, 40', or one or more reaction zones 44, 44', respectively, of the precursor supply head 30. Thus, the substrates are successively subjected to the precursors supplied via the one or more gas distribution elements 40, 40', or one or more reaction zones 44, 44', respectively, of the precursor supply head 30 due to the relative rotational movement. During the rotation, the substrates travel past the one or more gas distribution elements 40, 40', or one or more reaction zones 44, 44', respectively, of the precursor supply head 30 and are thus subjected to the precursors.

The apparatus 2 comprises a rotating mechanism 64, 66. The substrate support 60 and the precursor supply head 30 are arranged to be rotated relative to each other with the rotating mechanism 64, 66. The substrate support 60 and the precursor supply head 30 are arranged to be rotated relative to each other with the rotating mechanism such that the support surface 63 of the substrate support 60 and the output face 33 of the precursor supply head 30 are arranged to be rotated relative to each other.

In the embodiment of FIG. 1, the rotating mechanism 64, 66 or the rotating device 64 is connected to the substrate support 60 for rotating the substrate support 60. The rotating device 64 comprises a rotating motor or the like device arranged to output rotating movement.

The rotating device 64 is connected to the substrate support 60 with a rotating axis 66 arranged to transfer rotating movement from the rotating device 60 to the substrate support 60. The rotating device 64 and the rotating axis 66 are arranged to rotate the substrate support 60 in rotation direction A.

The rotating axis 66 extends perpendicularly to the support surface 63.

Accordingly, the rotating axis 66 extends in vertical direction.

As shown in FIG. 1, the rotating device 64 is arranged outside the process chamber 10. The rotating axis 66 extends between the rotating device 64 and the substrate support 60. Accordingly, the rotating axis 66 extends from outside the process chamber 10 through the chamber walls into the process chamber 10 and further to the substrate support 60.

The rotating device 64 is arranged in vertical direction below the substrate support 60.

In embodiments comprising the separate vacuum chamber surrounding the process chamber 10, the rotating device 64 is arranged outside of the vacuum chamber. Accordingly, the rotating axis 66 extends from outside the vacuum chamber through the vacuum chamber walls into the vacuum chamber and further through the chamber walls into the process chamber 10 and to the substrate support 60.

Figure 2:
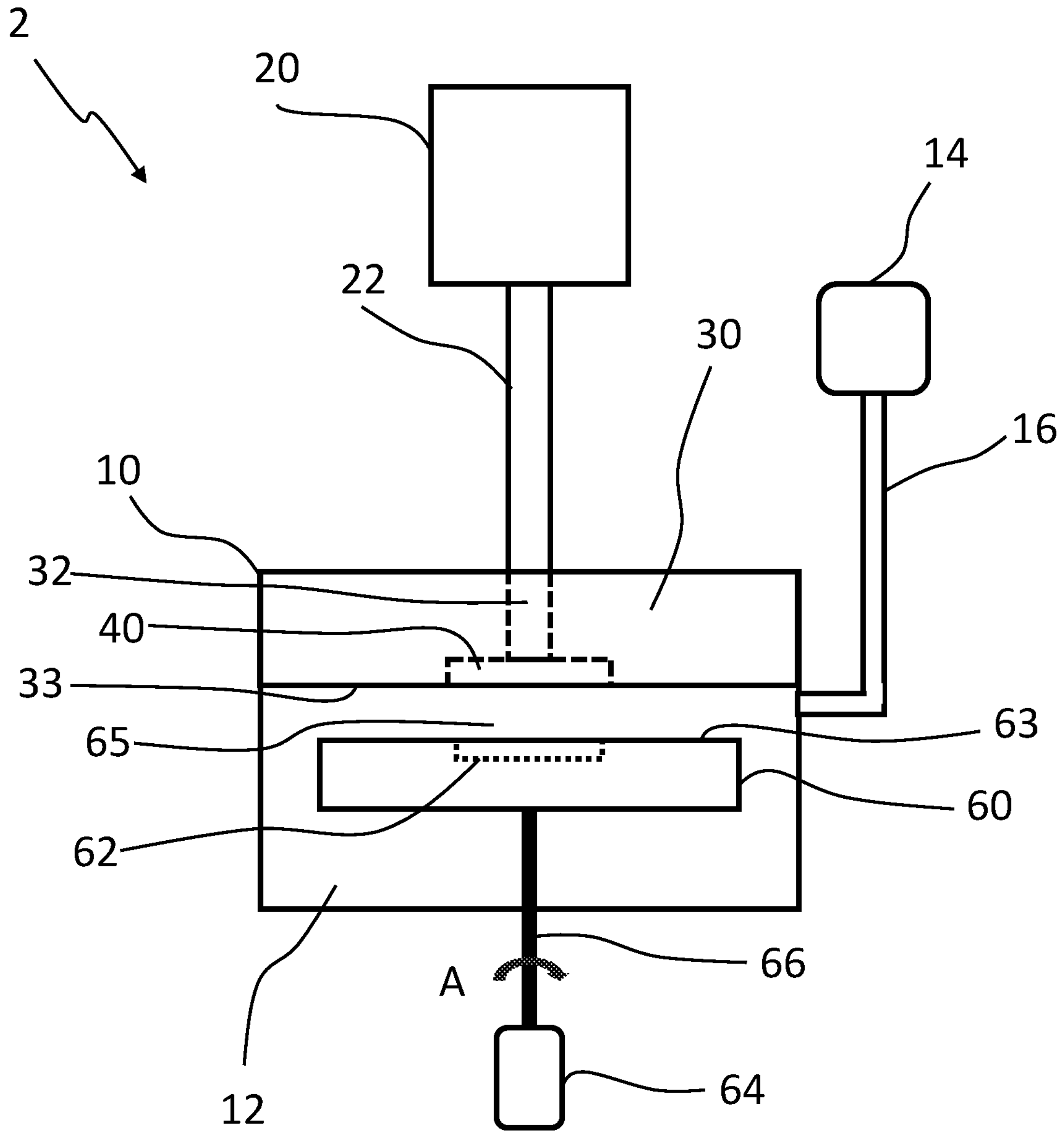
FIG. 2 shows a schematic view of another embodiment of an apparatus according to the present invention.

FIG. 2 shows another embodiment of the apparatus according to the present invention. In this embodiment, the precursor supply head 30 is arranged to form part of the process chamber walls of the process chamber 10.

Therefore, the output face 33 of the precursor supply head 30 is arranged to form a wall of the process chamber and define the process chamber space 12. Therefore, the precursor supply head 30 is not arranged inside the chamber space 12. However, the substrate support 60 is arranged inside the chamber space 12. The substrate support 30 is arranged to be rotated in the rotating direction A inside the chamber space 12 with the rotating device 64.

In the embodiment of FIG. 2, the output face 33 o the precursor supply head 30 is arranged inside the chamber space 12 of the process chamber 10.

Further, in FIG. 2 the output face 33 of the precursor supply head 30 is arranged to form one of the chamber walls, the top wall.

Figure 3:
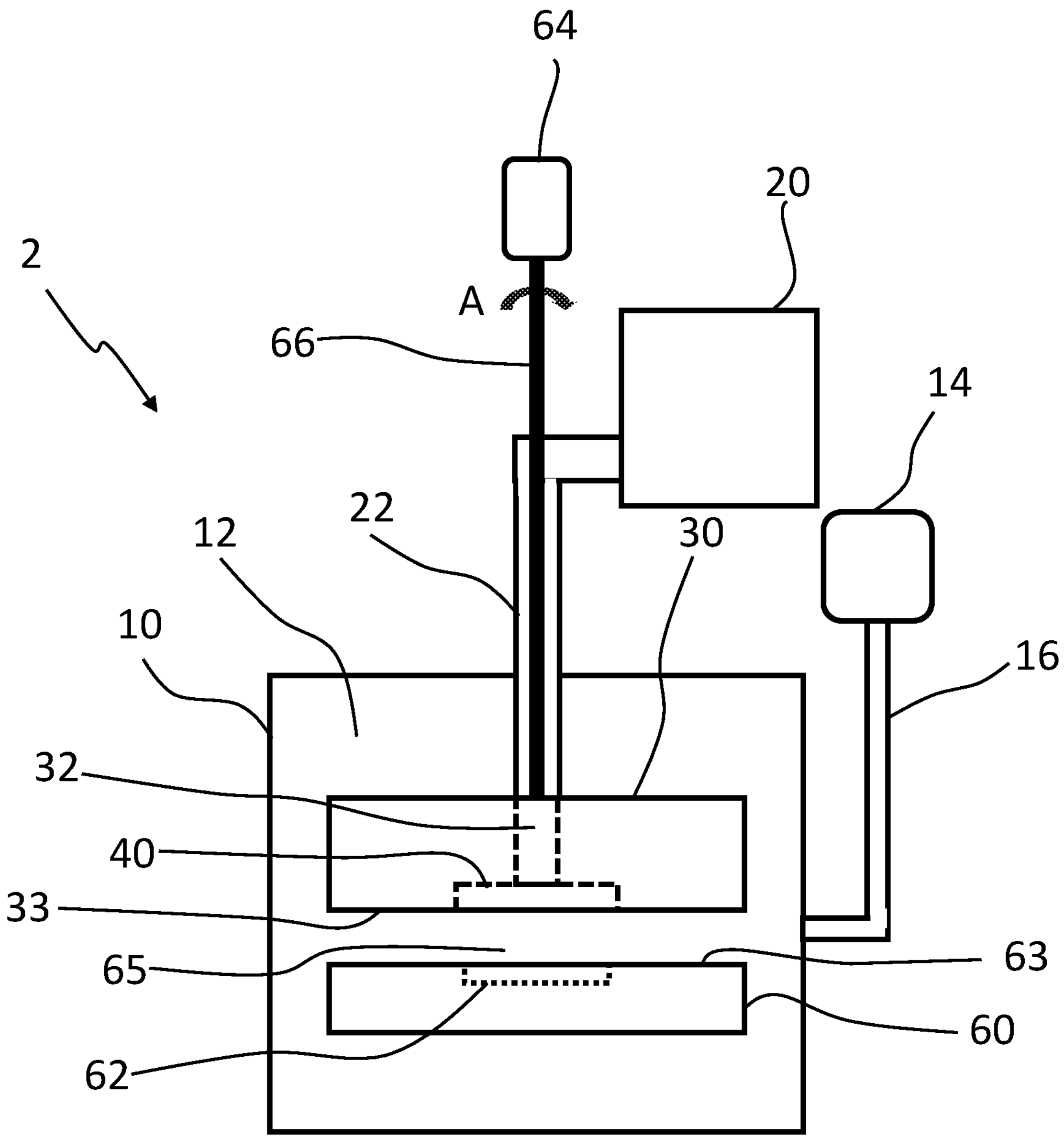
FIG. 3 shows a schematic view of yet another embodiment of an apparatus according to the present invention.

FIG. 3 shows a further embodiment, in which the rotating mechanism 64, 66 or the rotating device 64 is connected to the precursor supply head 30 with the rotating axis 66 for rotating the precursor supply head 30 in the rotation direction A. In this embodiment, the substrate support 60 is provided stationary.

The rotating device 64 is arranged in vertical direction above the precursor supply head 30. The rotating axis 66 extends in vertical direction.

It should be noted that the apparatus may also comprise two rotating mechanisms 64, 66 for rotating the substrate support 60 and the precursor supply head 30, respectively, separately and independently of each other.

Furthermore, it should be noted that the precursor supply head 30 may also be arranged below the substrate support 60.

The substrate support 60 and/or the precursor supply head 30 are preferably cylindrical elements circular cylindrical shape. The circular cylindrical shape is advantageous for smooth and balanced rotation.

Accordingly, at least the one of the substrate support 60 and/or the precursor supply head 30 which is rotated has a circular cylindrical shape.

The support surface 63 and/or the output face 33 have circular shape. Accordingly, at least the one of the substrate support 60 and/or the precursor supply head 30 which is rotated has the support surface 63 or the output face 33, respectively, with the circular shape.

The support surface 63 and the output face 33 have preferably similar or identical shape, for example the circular shape.

Figure 4:
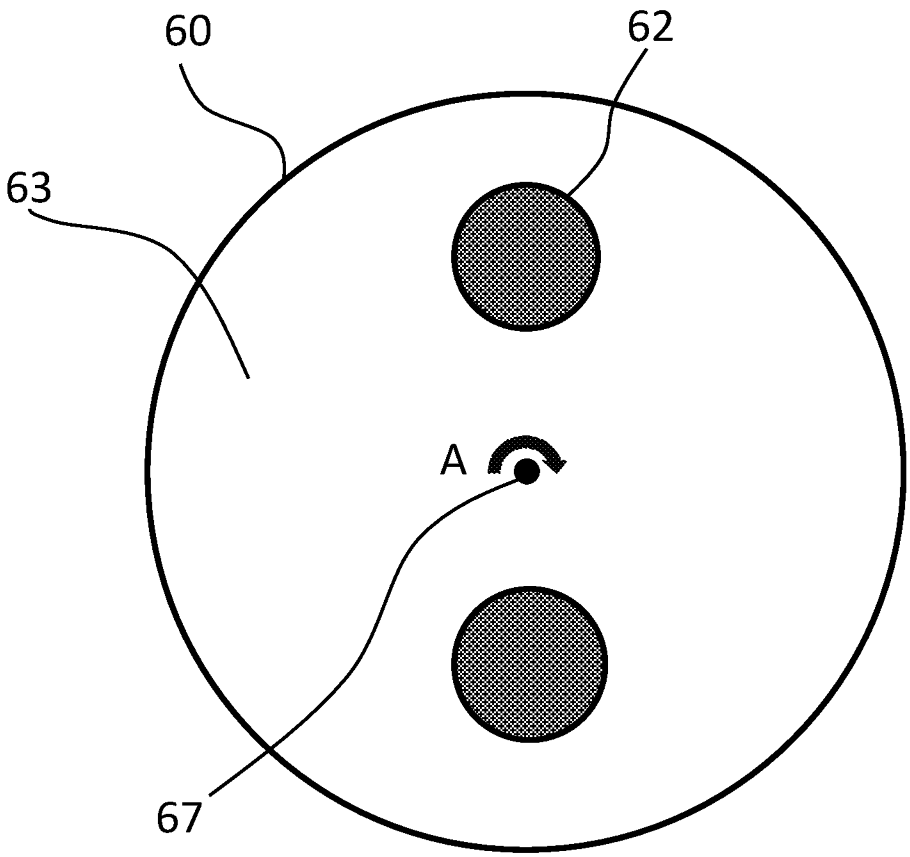
FIG. 4 shows a schematic top view of a substrate support.

FIG. 4 shows a top view of one embodiment of the substrate support 60. The substrate support 60 and the support surface 63 has a support centre point 67 or support central axis 67. The support centre point 67 is the centre point of the circular support surface 63. The rotating axis 66 is connected to the substrate support 60 at the support centre point 67 or along the support central axis 67. Thus, the substrate support 60 and the support surface 63 are rotated in the rotation direction A around the rotation axis 66 and the support centre point 67 or the support central axis 67.

The substrate support 60 comprises two substrate holders 62 provided on the support surface 63 for holding two substrates. Each of the substrate holders 62 are arranged to receive and hold one substrate.

The substrate holders 62 are arranged to the support surface 63 opposite to each other on opposite sides of the support centre point 67.

In alternative embodiments, there may be one or more substrate holders 62. Preferably, there are two or more substrate holders 62 arranged symmetrically relative to each other and the support centre point 67.

The substrate holders 62 are arranged successively or adjacent to each other in the rotation direction A.

Thus, the substrate holders 62 are at the same distance from the support centre point 67.

Figure 5:
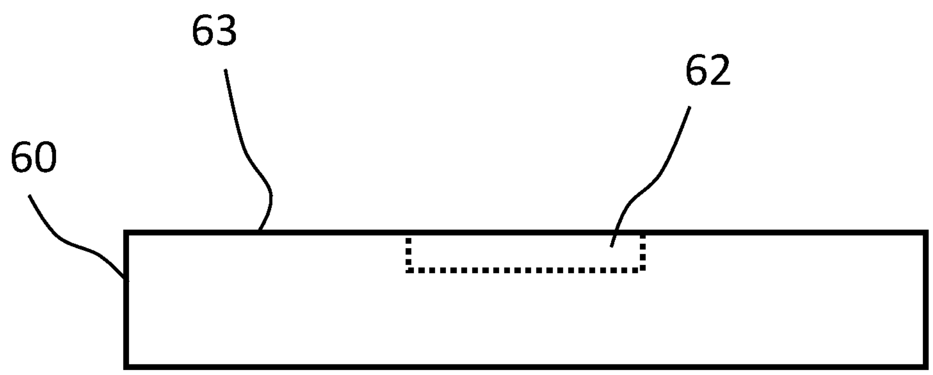
FIG. 5 shows a schematic side view of the support of FIG. 4.

FIG. 5 shows a side of the substrate support 60 of FIG. 4. The substrate holders 62 are formed as substrate holder recesses provided on the support surface 63 for receiving one or more substrates, respectively. The substrate holder recess 62 is arranged receive the substrate such that the upper surface of the substrate is facing towards the output face 33 of the precursor supply head 30. Further, the upper surface of the substrate is preferably parallel to the support surface 63 and the output face 33.

Thus, the bottom of the substrate holder recess 62 may be arranged parallel to the support surface 63 and the output face 33.

Figure 6:
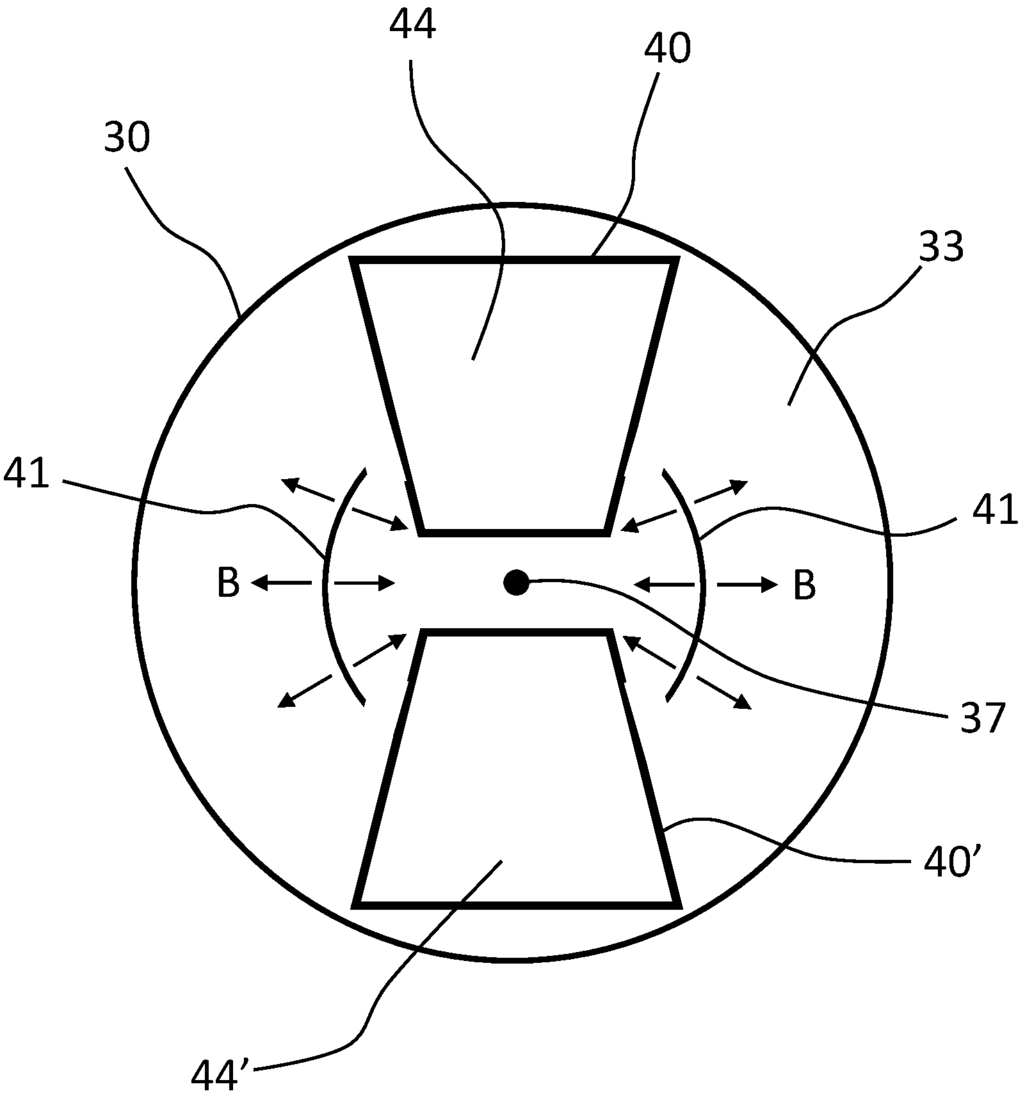
FIG. 6 shows a schematic top view of one embodiment of a precursor supply head.

FIG. 6 shows one embodiment of the precursor supply head 30 and the output face 33 thereof. The precursor supply head 30 and the output face 33 has a head centre point 37 or head central axis 37. The head centre point 37 is the centre point of the circular output face 33.

The head centre point 37 is arranged in line with the rotating axis 66 of the rotating mechanism 64, 66.

Alternatively or additionally, the head centre point 37 is arranged line with or directly opposite the support centre point 67 or the support central axis 67.

The output face 33 is provided with two gas distribution elements 40, 40' via which precursors are supplied. The two gas distribution elements 40, 40' provide two reaction zones 44, 44', respectively.

In one embodiment, a first gas distribution element 40 and a first reaction zone 44 is arranged to supply a first precursor. Similarly, a second gas distribution element 40' and a second reaction zone 44' is arranged to supply a second precursor.

The first and second gas distribution elements 40, 40', and the first and second reaction zones 44, 44', respectively, are provided symmetrically relative to each other on the output face 33. Furthermore, first and second gas distribution elements 40, 40', and the first and second reaction zones 44, 44', respectively, are provided symmetrically relative to head centre point 37.

The first and second gas distribution elements 40, 40' are arranged to the output face 33 opposite to each other on opposite sides of the head centre point 37.

In alternative embodiments, there may be one or more gas distribution elements 40, 40'. Preferably, there are two or more gas distribution elements 40, 40' arranged symmetrically relative to each other and the head centre point 37.

The gas distribution elements 40, 40' are arranged successively or adjacent to each other in the rotation direction A.

Thus, the gas distribution elements 40, 40' are at the same distance from the head centre point 37.

Further, the gas distribution elements 40, 40' are arranged at same distance from the head centre point 37 and the substrate holders 62 are from the support centre point 67. Thus, during rotating movement the substrate holders 62 and the substrates therein travel past the gas distribution elements 40, 40' and the reaction zones 44, 44' thereof for subjecting the substrates to the precursors.

The precursor supply head 30 comprises intermediate purge gas feeding nozzles 41 arranged to the output face 33 adjacent the gas distribution elements 40, 40' or the reaction zones 44, 44'.

Accordingly, intermediate purge gas feeding nozzles 41 are arranged adjacent each of the gas distribution elements 40, 40' or the reaction zones 44, 44', on opposite sides of the gas distribution elements 40, 40' or the reaction zones 44, 44', as shown in FIG. 6.

Further, intermediate purge gas feeding nozzles 41 arranged between adjacent gas distribution elements 40, 40' or reaction zones 44, 44'.

In embodiments having the first and second gas distribution elements 40, 40' or the first and second reaction zones 44, 44', the intermediate purge gas feeding nozzles 41 arranged between the first and second gas distribution elements 40, 40' or the first and second reaction zones 44, 44'.

The term adjacent in connection with the intermediate purge gas nozzles 41 means adjacent the gas distribution element 40, 40' or the reaction zone 44, 44' in the rotation direction A. Thus, it means adjacent on the output face 33 in the rotation direction A around the head centre point 37. This applies also to embodiments, in which only the substrate support 60 is rotated.

The term between in connection with the intermediate purge gas nozzles 41 means between two gas distribution elements 40, 40' or two reaction zones 44, 44' in the rotation direction A. Thus, it means on the output face 33 between adjacent gas distribution elements 40, 40' or adjacent reaction zones 44, 44' in the rotation direction A around the head centre point 37. This applies also to embodiments, in which only the substrate support 60 is rotated.

In the embodiment of FIG. 6, the intermediate purge gas feeding nozzles 41 have a longitudinal curved form and are arranged to extend between the adjacent reaction zones 44, 44'. Accordingly, the intermediate purge gas feeding nozzles 41 extend in a direction between the adjacent gas distribution elements 40, 40' or adjacent reaction zones 44, 44'.

Furthermore, the intermediate purge gas feeding nozzles 41 are arranged to extend in the rotation direction A around the head centre point 37. This applies also to embodiments, in which only the substrate support 60 is rotated. Thus, the intermediate purge gas feeding nozzles 41 have a longitudinal curved form with constant radius from the head centre point or form the rotating axis 66 or the support centre point 67. Thus, the curved intermediate purge gas feeding nozzles extend in the rotation direction A between adjacent the adjacent gas distribution elements 40, 40' or adjacent reaction zones 44, 44'.

The purge gas flow B is directed in radial direction of the rotation direction A or in radial direction of the head centre point, as shown in FIG. 6. This provides transversal purge gas flow between the adjacent gas distribution elements 40, 40' or adjacent reaction zones 44, 44'. Thus, the purge gas is directed to or inwards the reaction gap 65 and inside the reaction gap 65, as well as outwards from the reaction gap 65 to process chamber space 12 surrounding precursor supply head 30 and the substrate support 60 and further out of the reaction gap 65.

The curved intermediate purge gas feeding nozzles 41 may be replaced by longitudinal linear intermediate purge gas feeding nozzles 41 extending in a direction between adjacent the adjacent gas distribution elements 40, 40' or adjacent reaction zones 44, 44'. Alternatively, the intermediate purge gas feeding nozzles 41 of FIG. 6 may be curved in alternative manner between adjacent the adjacent gas distribution elements 40, 40' or adjacent reaction zones 44, 44'.

Figure 7:
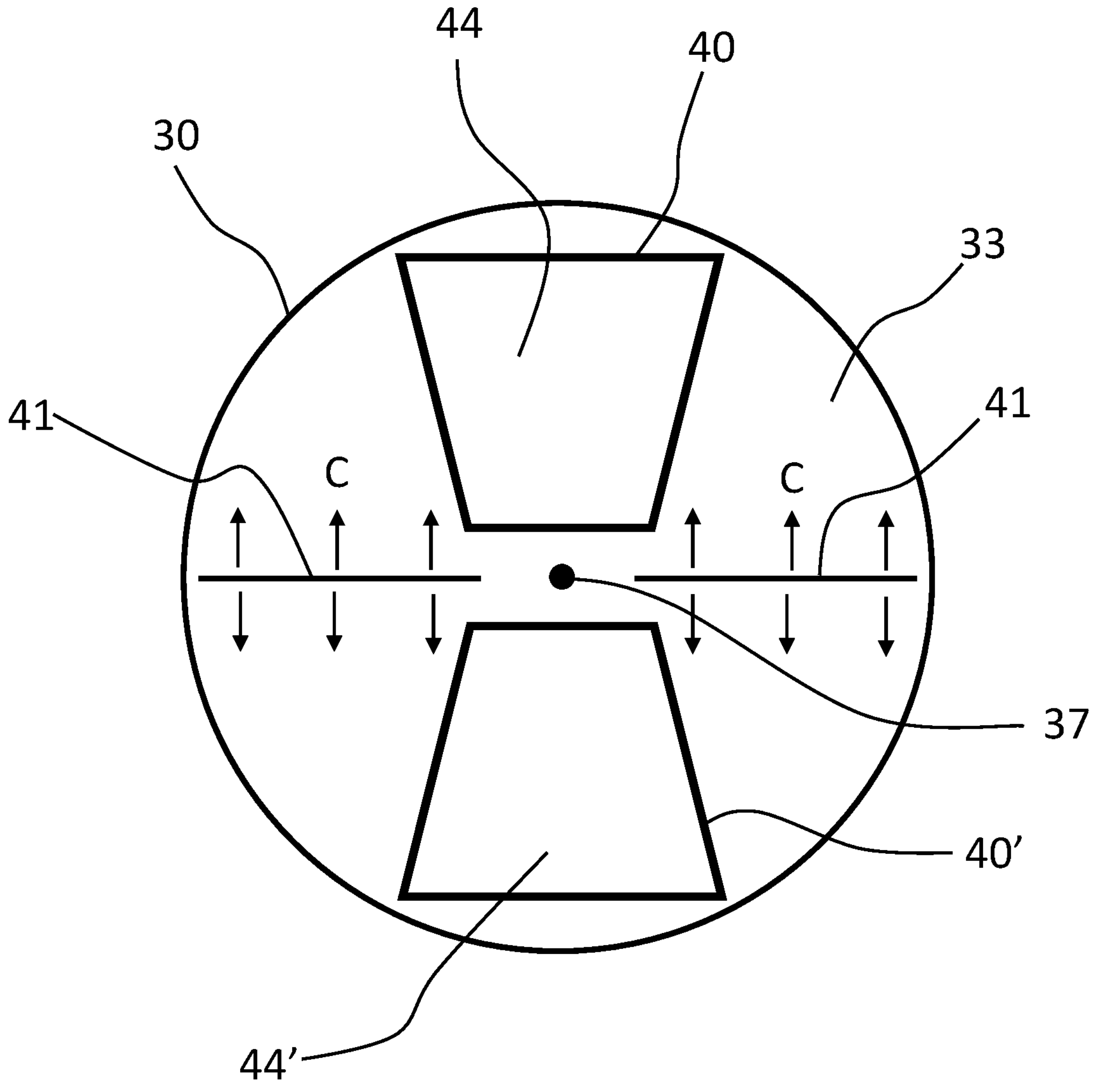
FIG. 7 shows a schematic top view of another embodiment of a precursor supply head.

FIG. 7 shows an alternative embodiment, in which the longitudinal intermediate purge gas feeding nozzles 41 are arranged on the output face 33 and to extend in a direction away from the head centre point 37 of the precursor supply head 30.

Further, the longitudinal intermediate purge gas feeding nozzles 41 are arranged to extend radially in a direction away from the head centre point 37 of the precursor supply head 30. The longitudinal intermediate purge gas feeding nozzles 41 are arranged between adjacent the adjacent gas distribution elements 40, 40' or adjacent reaction zones 44, 44' in the rotation direction A.

In the embodiment of FIG. 7, the longitudinal intermediate purge gas feeding nozzles 41 extend in linear direction. However, in alternative embodiments, the longitudinal intermediate purge gas feeding nozzles 41 may also be curved.

Furthermore, the longitudinal intermediate purge gas feeding nozzles 41 may be arranged to extend also in a direction away from the head centre point 37 other than the radial direction form the head centre point 37.

The purge gas flow C is directed in the rotation direction A at the longitudinal intermediate purge gas feeding nozzles 41 or in tangential direction of the head centre point 37, as shown in FIG. 7. This provides a purge gas flow C against or towards the adjacent gas distribution elements 40, 40' or adjacent reaction zones 44, 44'.

The intermediate purge gas feeding nozzles 41 may be provided to the output face 33 as longitudinal slots.

The intermediate purge gas feeding nozzles 41 are connected to a purge gas source of the precursor supply system 20 via a purge gas supply conduit 22 and purge gas supply channel 32.

Figure 8:
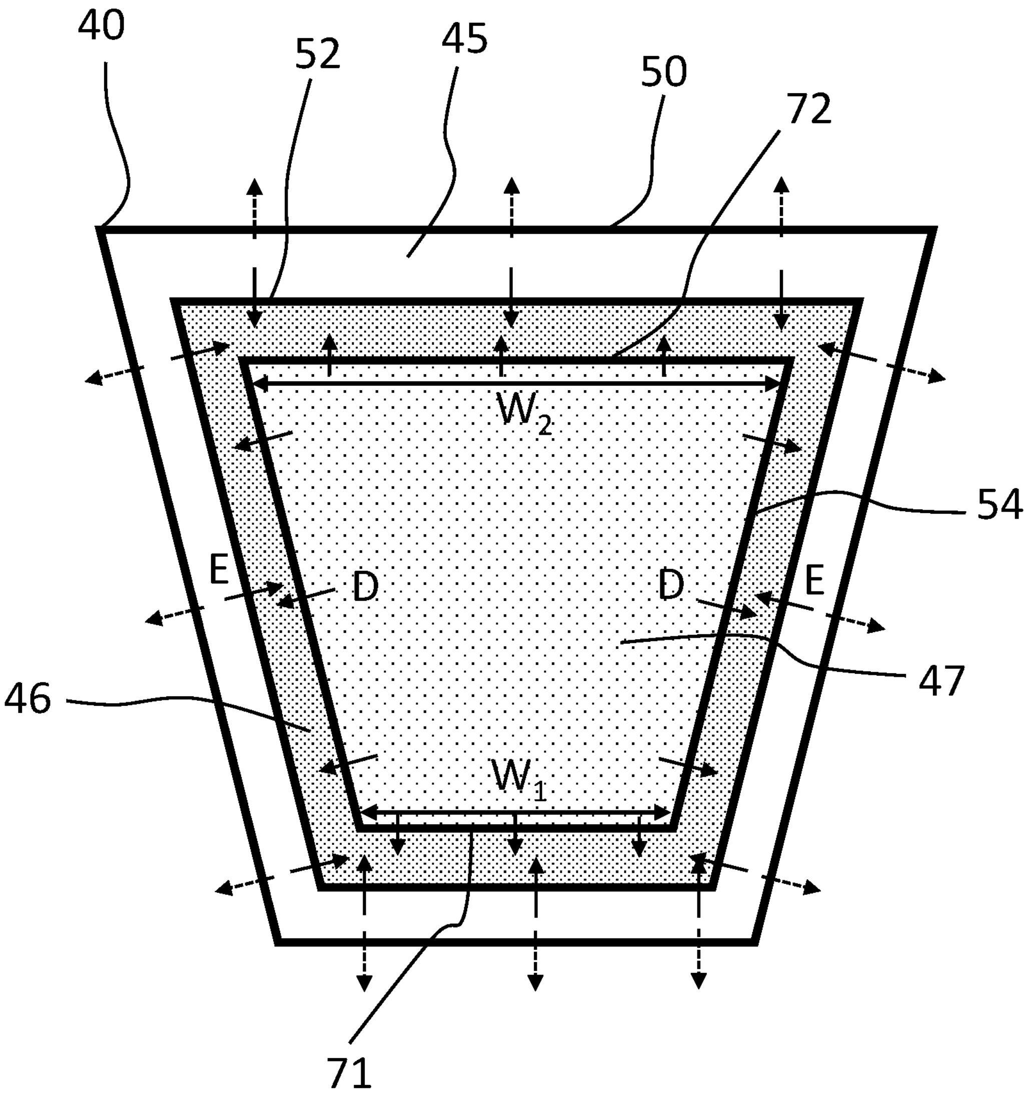
FIG. 8 shows a schematic view of one embodiment of a reaction zone according to the present invention.

FIG. 8 shows schematically one embodiment of a gas distribution element 40 or a reaction zone 44.

The gas distribution element 40 or the reaction zone 44 comprises a precursor supply zone 47 open to the output face 33 of the precursor supply head 30 for supplying precursor.

The precursor supply zone 47 of the gas distribution element 40 is provided by a precursor supply nozzle 54.

The precursor supply zone 47 is formed as a precursor supply area and arranged as a central area of the reaction zone 44 or the gas distribution element 40.

Further, the precursor supply nozzle 54 is arranged to provide a central nozzle of the gas distribution element 40.

The gas distribution element 40 or the reaction zone 44 further comprises a suction zone 46 open to the output face 33 of the precursor supply head 30. The suction zone 46 and arranged to surround the precursor supply zone 47 at the output face 33 of the precursor supply head 30.

The suction zone 46 of the gas distribution element 40 is provided by a suction nozzle 52. The suction nozzle 52 is arranged to surround the precursor supply nozzle 54 in the gas distribution element 40 and on the output surface 33.

Accordingly, the suction zone 46 is arranged to surround the precursor supply zone 47 circumferentially in the reaction zone 44 and on the output face 33.

Similarly, the suction nozzle 52 is arranged surround the precursor supply nozzle 54 circumferentially in the gas distribution element 40 and on the output surface 33.

Therefore, the suction zone 46 and the suction nozzle 52 surround the precursor supply zone 47 and the precursor supply nozzle 54, respectively, from all directions on the output face 33.

As shown in FIG. 8, precursor supplied from the precursor supply zone 47 and the precursor supply nozzle 54 flows from the precursor supply zone 47 towards the suction zone 46 as indicated by arrows D. Thus, precursor is prevented from escaping away from the reaction zone 44 and from the gas distribution element 40 to surroundings.

In preferred embodiments, the gas distribution element 40 or the reaction zone 44 further comprises a purge gas supply zone 45 open to the output face 33 of the precursor supply head 30. The purge gas supply zone 45 is arranged to surround the suction zone 46 and the precursor supply zone 47 at the output face 33 of the precursor supply head 30. Accordingly, the suction zone 46 is provided between the precursor supply zone 47 and the purge gas supply zone 45 at the output face 33 of the precursor supply head 30.

The purge gas supply zone 45 of the gas distribution element 40 is provided by a purge gas supply nozzle 50. The purge gas supply nozzle 50 is arranged to surround the suction nozzle 52 in the gas distribution element 40 and on the output surface 33.

Accordingly, the purge gas supply zone 45 is arranged to surround the suction zone 46 circumferentially in the reaction zone 44 and on the output face 33.

Similarly, the purge gas supply nozzle 50 is arranged surround the suction nozzle 52 circumferentially in the gas distribution element 40 and on the output surface 33.

Therefore, the purge gas supply zone 45 and the purge gas supply nozzle 50 surround the suction zone 466 and the suction nozzle 52, respectively, from all directions on the output face 33.

As shown in FIG. 8, purge gas supplied from the purge gas supply zone 45 and the purge gas supply nozzle 50 flows from the purge gas supply zone 45 towards the suction zone 46 as indicated by arrows E.

The purge gas flow direction E is opposite to the precursor flow direction D. Thus, precursor is efficiently prevented from escaping away from the reaction zone 44 and from the gas distribution element 40 to surroundings.

According to the above mentioned, the suction zone 46 is provided between the precursor supply zone 47 and the purge gas supply zone 45 in the reaction zone 44 on the output face 33. Further, the suction nozzle 52 is arranged between the precursor supply nozzle 54 and the purge gas supply nozzle 50 in the gas distribution element 40 on the output face 33.

As shown in FIGS. 6, 7 and 8 width of the precursor supply zone 47 increases in a direction away from the head centre point 37 or in radial direction of the head centre point 37. Similarly, width of the precursor supply nozzle 54 increases in a direction away from the head centre point 37 or in radial direction of the head centre point 37.

Accordingly, width $W_1$ of proximal end 71 of the precursor supply zone 47 or the precursor supply nozzle 54 is less than width $W_2$ of distal end 72 of the precursor supply zone 47 or the precursor supply nozzle 54. The proximal end 71 of the precursor supply zone 47 or the precursor supply nozzle 54 is the end closer to the head centre point 37 and the distal end 71 of the precursor supply zone 47 or the precursor supply nozzle 54 is the end further from the head centre point 37.

The width of the precursor supply zone 47 or the precursor supply nozzle 54 is perpendicular to the radial direction from the head centre point 37.

Figure 9:
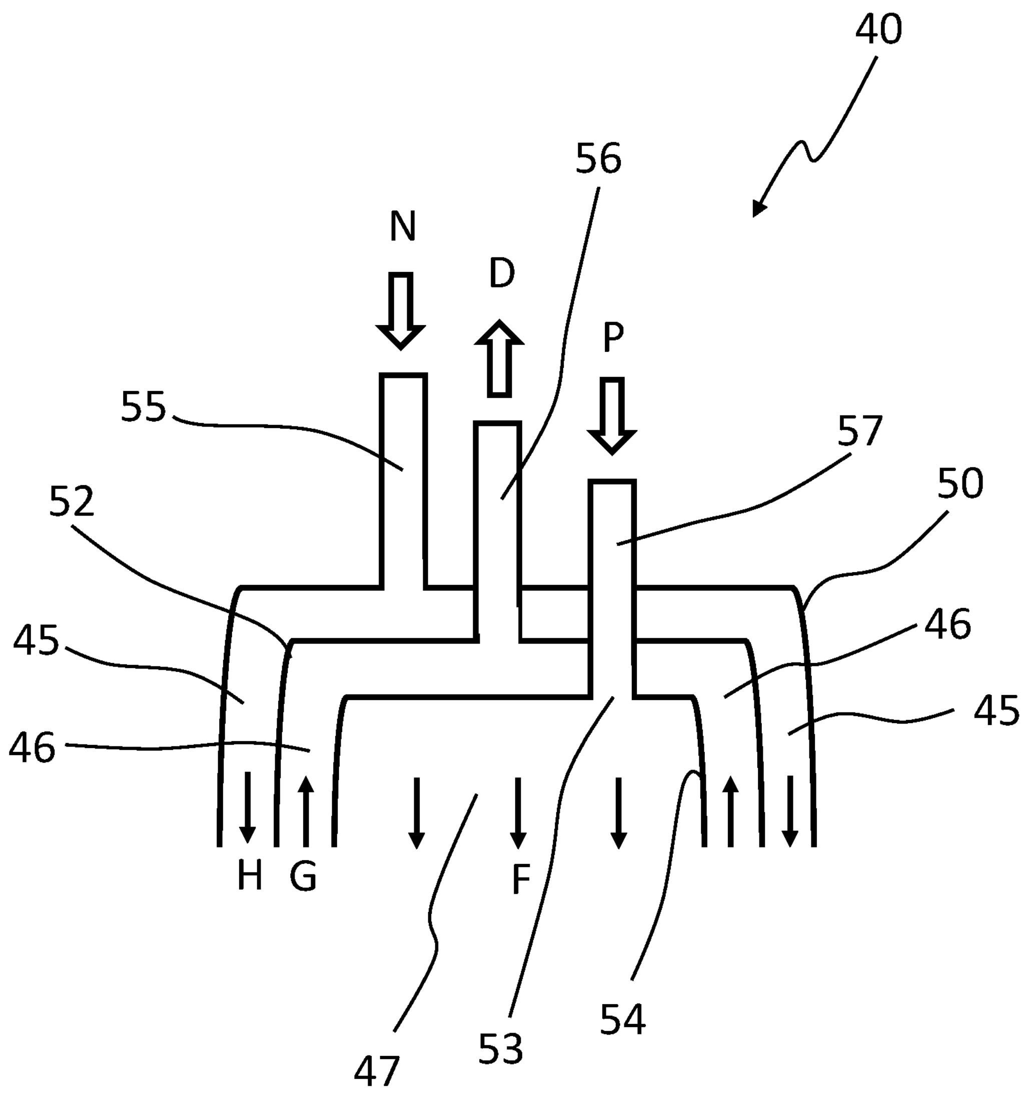
FIG. 9 shows a schematic cross-sectional side view of one embodiment of the reaction zone.

FIG. 9 shows a schematic cross-sectional side view of the gas distribution element 40. The gas distribution element 40 is provided by a precursor supply nozzle 54 arranged to form the precursor supply zone 47 of the reaction zone 44.

Precursor P is supplied from a precursor source via a precursor supply channel 57 and one or more precursor supply openings 53 to the precursor supply nozzle 54. The one or more precursor supply openings 53 are provided between the precursor supply channel 57 and the precursor supply nozzle 54. The precursor P is further supplied towards the support surface 63 or substrate as indicated by arrows F in FIG. 9.

The precursor supply nozzle 54 is arranged to form the precursor supply zone 47 as a precursor supply area and as a central area of the reaction zone 44. Further, the precursor supply nozzle 54 is arranged to provide a central nozzle of the gas distribution element 40.

The precursor supply zone 47 or the precursor supply nozzle 54 is provided as a recess 54 to the output face 33 of the precursor supply head 30. The recess 54 or the precursor supply nozzle 54 open to the output face 33 of the precursor supply head 30.

As shown in FIG. 9, there may be one or more, preferably two or more precursor supply openings 53 open to the precursor supply zone 47 and the precursor supply nozzle 54 or recess for distributing precursor P to the precursor supply zone 47.

Precursor P and purge gas N are discharged via a suction channel 56 and suction nozzle 52 and suction zone 46. The suction channel 56 is connected to the suction nozzle 52 and to the suction zone 46. Precursor P and purge gas N are discharged from the output face 33 and form the reaction gap 65 indicated by arrows G in FIG. 9.

The suction nozzle 52 is arranged to form the suction zone 46 as a suction slot arranged to surround the precursor supply zone 47 and precursor supply nozzle 54 circumferentially on the output face 33 of the precursor supply head 30.

Purge gas N is supplied from a purge gas source via a purge gas supply channel 55 to the purge gas supply nozzle 50. Purge gas N is further supplied towards the support surface 63 or substrate as indicated by arrows H in FIG. 9.

The purge gas supply nozzle 50 is arranged to form the purge gas supply zone 45 as a purge gas slot arranged to surround the suction zone 46 and the suction nozzle 52 circumferentially on the output face 33 of the precursor supply head 30.

Figure 10:
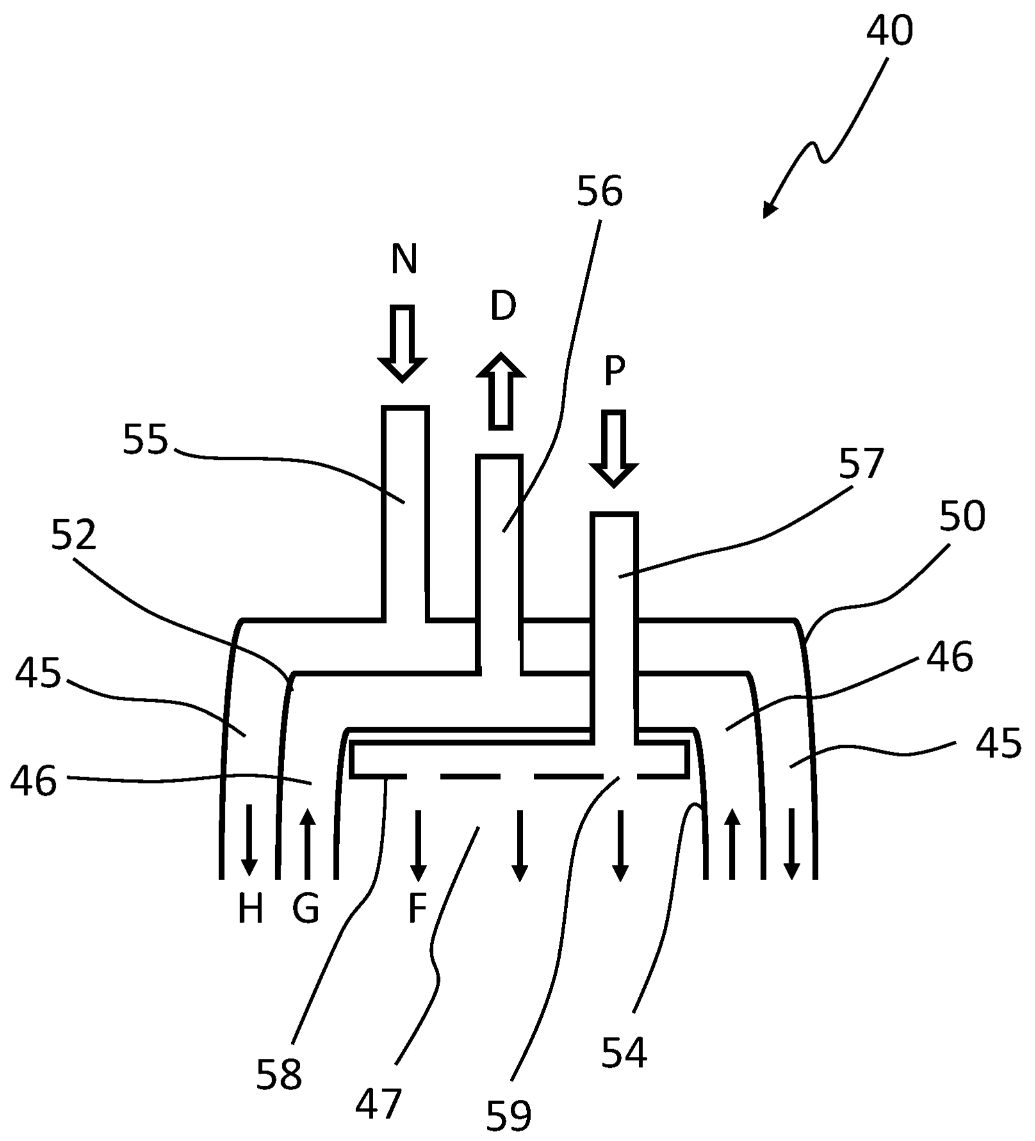
FIG. 10 shows a schematic cross-sectional side view of another embodiment of the reaction zone.

FIG. 10 shows an embodiment, in which a precursor distribution element 58 provided to the precursor supply zone 47 and to the precursor supply nozzle 54. The precursor distribution element 58 is connected to the precursor supply channel 57 for receiving precursor P form the precursor source. The precursor distribution element 58 comprises one or more precursor distribution openings 59 open to precursor supply nozzle 54 and the precursor supply zone 47. Preferably, the precursor distribution element 58 comprises two or more precursor distribution openings 59 open to precursor supply nozzle 54 and the precursor supply zone 47 for distributing the precursor over the area of the precursor supply zone 47. Accordingly, the precursor distribution element 58 covers the precursor supply zone 47 for distributing the precursor over the area of the precursor supply zone 47.

Figure 11:
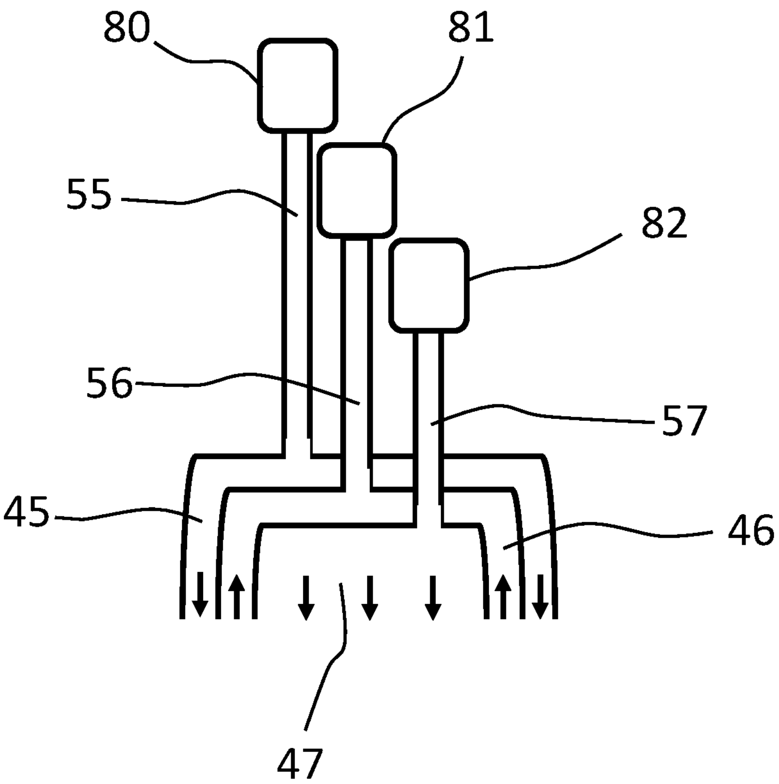
FIGS. 11 and 12 show schematically cross-sectional side views a first and second reaction zones.
Figure 12:
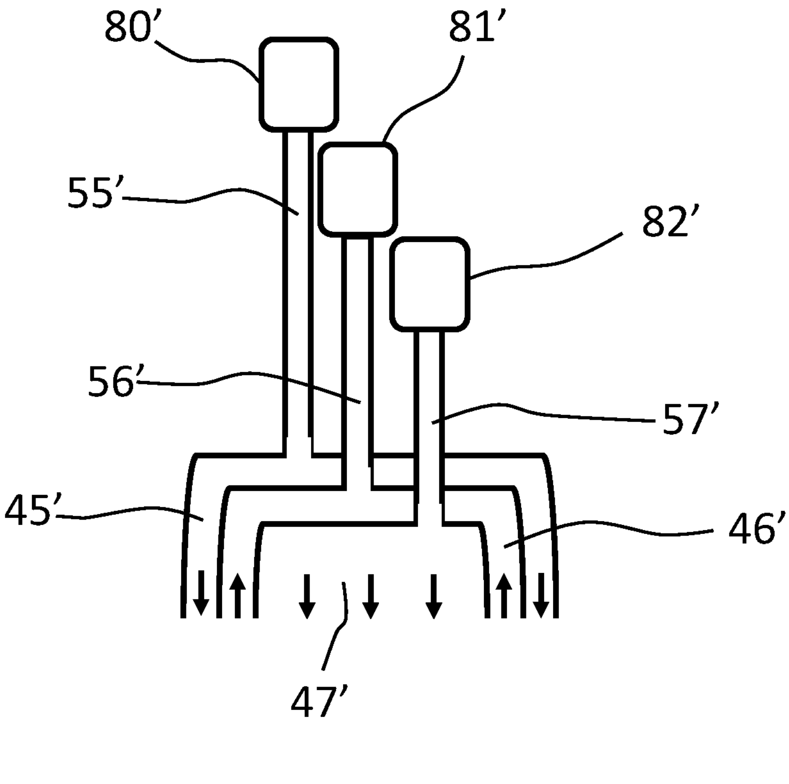

FIGS. 11 and 12 shows a first gas distribution element 40 and a second gas distribution element 40', respectively. The first and second gas distribution elements 40, 40' of FIGS. 11 and 12 correspond the first and second gas distribution elements 40, 40' of FIGS. 6 and 7.

A first precursor source 82 comprising first precursor is connected to the first precursor supply area 47 or the first purge gas supply nozzle of the first gas distribution element 40 via the first precursor supply channel 57. A first suction device 81 is connected to the first suction zone 46 or the first suction nozzle of the first gas distribution element 40 via the first suction channel 56. A first purge gas source 80 is connected to the first purge gas supply area 45 or the first purge gas supply nozzle of the first gas distribution element 40 via the first purge gas supply channel 55.

The first precursor source 82, the first suction device 81 and the first purge gas source 80 are provided to the precursor supply system 20 of the apparatus 2.

The first precursor supply channel 57, the first suction channel 56, and the first purge gas supply channel 55 represent or are comprised in the conduits 22 and the channels 32 of FIGS. 1, 2 and 3.

A second precursor source 82' comprising second precursor is connected to the second precursor supply area 47' or the second purge gas supply nozzle of the second gas distribution element 40' via the second precursor supply channel 57'. A second suction device 81' is connected to the second suction zone 46' or the second suction nozzle of the second gas distribution element 40' via the second suction channel 56'. A second purge gas source 80' is connected to the second purge gas supply area 45' or the second purge gas supply nozzle of the second gas distribution element 40' via the second purge gas supply channel 55'.

The second precursor source 82', the second suction device 81' and the second purge gas source 80' are provided to the precursor supply system 20 of the apparatus 2.

The second precursor supply channel 57', the second suction channel 56', and the second purge gas supply channel 55' represent or are comprised in the conduits 22 and the channels 32 of FIGS. 1, 2 and 3.

Further, the first and second suction devices 81, 81' may be provided as one common suction device.

Further, the first and second purge gas sources 80, 80' may be provided as one common purge gas source.

The same purge gas source may be also connected to the intermedia purge gas supply nozzles 41.

The invention has been described above with reference to the examples shown in the figures. However, the invention is in no way restricted to the above examples but may vary within the scope of the claims.

The invention claimed is:

1. An atomic layer deposition apparatus for processing a surface of a substrate successively with at least a first precursor and a second precursor according to principles of atomic layer deposition, the apparatus comprising:

a substrate support having a support surface and arranged to support one or more substrates;

a precursor supply head having an output face, the output face being provided with at least one reaction zone via which precursors are supplied;

a process chamber having a process chamber space inside the process chamber, the substrate support and the precursor supply head being arranged inside the process chamber, the process chamber comprising a discharge connection provided to the process chamber and arranged to discharge gases from the process chamber space; and a rotating mechanism, the substrate support and the precursor supply head being arranged to be rotated relative to each other with the rotating mechanism such that the support surface of the substrate support and the output face of the precursor supply head are arranged to be rotated relative to each other, wherein the support surface of the substrate support and the output face of the precursor supply head are arranged opposite to each other such that a reaction gap is provided between the support surface of the substrate support and the output face of the precursor supply head, wherein the output face comprises two or more reaction zones, wherein each of the two or more reaction zones comprises:

a precursor supply zone open to the output face of the precursor supply head for supplying precursor;

a suction zone open to the output face of the precursor supply head and arranged to surround the precursor supply zone at the output face of the precursor supply head; and a purge gas supply zone open to the output face of the precursor supply head and arranged to surround the suction zone and the precursor supply zone at the output face of the precursor supply head;

wherein the suction zone is arranged between the precursor supply zone and the purge gas supply zone at the output face of the precursor supply head, and wherein the precursor supply head comprises intermediate purge gas feeding nozzles for separating adjacent reaction zones from each other to further prevent precursor mixing between different reaction zones.

2. The apparatus according to claim 1, wherein:

the rotating mechanism is connected to the substrate support and arranged to rotate the substrate support; or the rotating mechanism is connected to the precursor supply head and arranged to rotate the precursor supply head.

3. The apparatus according to claim 1, wherein the output face of the precursor supply head and the support surface of the substrate support are arranged parallel to each other such that a uniform reaction gap is provided between the support surface of the substrate support and the output face of the precursor supply head.

4. The apparatus according to claim 1, wherein the rotating mechanism comprises a rotating axis, and wherein the rotating axis is arranged perpendicularly to the output face and/or the support surface.

5. The apparatus according to claim 1, wherein the precursor supply zones of the two or more reaction zones are formed as precursor supply areas and arranged as central areas of the two or more reaction zones.

6. The apparatus according to claim 1, wherein the precursor supply zone is provided as a recess to the output face of the precursor supply head, the recess being open to the output face of the precursor supply head.

7. The apparatus according to claim 1, wherein the precursor supply zone of the reaction zone comprises:

two or more precursor supply openings open to the output face of the precursor supply head for distributing precursor over the precursor supply zone; or one or more precursor supply openings open to the recess for distributing precursor to the recess and over the precursor supply zone; or a precursor distribution element provided to the precursor supply zone and comprising one or more precursor distribution openings open to the output face of the precursor supply head for distributing precursor over the precursor supply zone; or a precursor distribution element provided to the recess, the precursor distribution element comprising one or more precursor distribution openings open to the recess for distributing precursor to the recess and over the precursor supply zone.

8. The apparatus according to claim 4, wherein the precursor supply head comprises a head center point provided in line with the rotating axis of the rotating mechanism, and wherein a width of the precursor supply zone increases in a direction away from the head center point.

9. The apparatus according to claim 1, wherein:

the suction zone is arranged to surround the precursor supply zone circumferentially on the output face of the precursor supply head; or the suction zone is provided as a suction slot arranged to surround the precursor supply zone circumferentially on the output face of the precursor supply head.

10. The apparatus according to claim 1, wherein, for each of the two or more reaction zones, the purge gas supply zone is arranged to surround the suction zone circumferentially on the output face of the precursor supply head.

11. The apparatus according to claim 10, wherein;

the purge gas supply zone is provided as a purge gas slot arranged to surround the suction zone circumferentially on the output face of the precursor supply head.

12. The apparatus according to claim 1, wherein:

the precursor supply head comprises a first reaction zone and a second reaction zone on the output face of the precursor supply head; or the precursor supply head comprises a first reaction zone and a second reaction zone on the output face of the precursor supply head, the first and second reaction zones being arranged opposite to each other on opposite sides of a head center point.

13. The apparatus according to claim 1, wherein:

the precursor supply head comprises intermediate purge gas feeding nozzles arranged adjacent the reaction zones on opposite sides of each of the reaction zones; or the precursor supply head comprises intermediate purge gas feeding nozzles arranged between adjacent reaction zones; or the precursor supply head comprises intermediate purge gas feeding nozzles arranged between a first reaction zone and a second reaction zone.

14. The apparatus according to claim 13, wherein:

the intermediate purge gas feeding nozzles are arranged to extend in a direction between the adjacent reaction zones; or the intermediate purge gas feeding nozzles are arranged to extend in a linear direction between the adjacent reaction zones; or the intermediate purge gas feeding nozzles have a longitudinal curved form and are arranged to extend between the adjacent reaction zones; or the intermediate purge gas feeding nozzles are arranged to extend in a direction away from a head center point of the precursor supply head; or the intermediate purge gas feeding nozzles are arranged to extend radially in a direction away from a head center point of the precursor supply head.

15. The apparatus according to claim 1, wherein:

the substrate support comprises one or more substrate holders provided on the support surface for holding one or more substrates; or the substrate support comprises one or more substrate holder recesses provided on the support surface for receiving one or more substrates, respectively.

16. The apparatus according to claim 1, wherein the substrate support is arranged in a vertical direction below the precursor supply head.

* * * * *